United States Patent [19]

Nakahata et al.

[11] Patent Number: 4,982,243
[45] Date of Patent: Jan. 1, 1991

[54] SCHOTTKY CONTACT

[75] Inventors: Hideaki Nakahata; Takahiro Imai; Hiromu Shiomi; Naoji Fujimori, all of Itami, Japan

[73] Assignee: Sumitomo Electric Industries, Ltd., Osaka, Japan

[21] Appl. No.: 329,825

[22] Filed: Mar. 28, 1989

[30] Foreign Application Priority Data

Mar. 28, 1988 [JP] Japan .................. 63-75177

[51] Int. Cl.$^5$ ............... H01L 29/48; H01L 29/04; H01L 29/80
[52] U.S. Cl. ................... 357/15; 357/60; 357/22; 357/61
[58] Field of Search ............ 357/15, 60, 22 J, 61

[56] References Cited

U.S. PATENT DOCUMENTS 3,896,473 7/1975 DiLorenzo et al. ............ 357/15
4,740,263 4/1988 Imai et al. ............ 156/613

FOREIGN PATENT DOCUMENTS 59-208821 11/1984 Japan .
59-213126 12/1984 Japan .

Primary Examiner—Rolf Hille
Assistant Examiner—Robert P. Limanek
Attorney, Agent, or Firm—Cushman, Darby & Cushman

[57] ABSTRACT

A schottky contact which comprises a single crystal diamond substrate, an epitaxial diamond layer formed on said substrate and a schottky electrode layer formed on said epitaxial diamond layer, wherein said substrate has at least one polished surface which inclines at an angle of not larger than 10° to a (100) plane and said epitaxial diamond layer is formed on said surface, provides a device which has good thermal resistance and environmental resistance and which device can be easily highly integrated.

6 Claims, 6 Drawing Sheets

SCHOTTKY CONTACT

BACKGROUND OF THE INVENTION

1. Field of the Invention

The present invention relates to a schottky contact which comprises an epitaxial diamond layer.

2. Description of the Related Art

Currently, silicon (Si) is predominantly used as a semiconductor material. Si is used in semiconductor devices which constitute an integrated circuit such as a logic circuit or a memory. Among the semiconductor devices, a metal oxide semiconductor (MOS) field effect transistor which can be easily highly integrated is used as the memory, and a bipolar transistor is used as a logic operator device which is required to act at a high speed.

Further, Si is used in various electronic devices such as an analog IC. A compound semiconductor such as GaAs or InP is being developed for specified applications such as optical devices and ultra high speed ICs.

However, Si cannot be used at a temperature higher than 200° C. and GaAs cannot be used at a temperature higher than 300° C. A carrier concentration increases since Si is intrinsic at temperatures higher than 200° C. due to its small band gap of 1.1 eV, and GaAs is also intrinsic at the temperature of not lower than 300° C. due to its small band gap of 1.5 eV.

Integration of integrated circuits have recently increased more and more, with a corresponding higher tendency for the device to generate heat. Since the heat causes malfunctions of the circuits, a way of releasing the heat is sought.

To solve the above problems, it is proposed to prepare a semiconductor device with good thermal resistance and good heat release by utilizing a diamond (cf. Japanese Patent Kokai Publication Nos. 213126/1984 and 208821/1984). Since diamond has a large band gap of 5.5 eV, the temperature range which corresponds to the intrinsic range of the diamond does not include temperatures lower than 1400° C. at which the diamond is thermally stable. The diamond has high chemical stability. Thus, the device made from the diamond can operate at an elevated temperature, with good environmental resistance. The diamond has a thermal conductivity of 20 [W/cm.K] which is 10 times larger than that of Si, and good ability to release heat. In addition, the diamond has a large carrier mobility (electron mobility: 2000 [cm$^2$/V.sec], hole mobility: 2100 [cm$^2$/V.sec] at 300K), a small dielectric constant (K=5.5), a large electrical field at breakdown ($E_B = 5 \times 10^6$ V/cm), etc. Thus, the diamond has the possibility to be used as a material for a device to act at a high frequency and large wattage.

The single crystal diamond layer which acts as an operating layer of the semiconductor device can be epitaxially grown on a single crystal diamond substrate by a vapor phase deposition method. Either of p- and n-type semiconductors can be prepared through the doping of suitable impurities. A schottky contact which is one of ways of preparing a device from the semiconductor can be formed by a combination of the p-type diamond and a metal such as gold (Au) or tungsten (W).

However, the epitaxial diamond layer has electrical properties which significantly vary with its crystallinity like other semiconductive materials. When the crystallinity is not good because of, for example, the presence of defects, a carrier mobility is small and the operation of the semiconductor device is disturbed by the defects.

The surface morphology of the diamond layer also has influences on the electrical properties. When the surface of the diamond layer on which the schottky contact is formed is rough, many interface levels are formed between the diamond layer and a schottky metal electrode formed thereon, and, as to schottky properties, a leakage current in the reverse direction is large or no rectification property is realized.

SUMMARY OF THE INVENTION

An object of the present invention is to provide a good schottky contact comprising an epitaxial diamond layer which has good surface smoothness and crystallinity.

This and other objects are achieved by a schottky contact which comprises a single crystal diamond substrate, an epitaxial diamond layer formed on said substrate and a schottky electrode layer formed on said epitaxial diamond layer, wherein said substrate has at least one polished surface which inclines at an angle of not larger than 10° to a (100) plane and said epitaxial diamond layer is formed on said surface.

DETAILED DESCRIPTION OF THE INVENTION

Figure 1A:
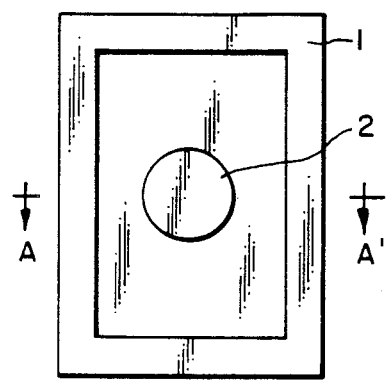
FIG. 1A is a plane view of one embodiment of a device according to the present invention.

According to the present invention, the diamond layer is epitaxially grown on the surface of the single crystal diamond, which surface inclines at an angle of not larger than 10° to the (100) plane, and then the schottky electrode is formed on the epitaxial diamond layer.

It has been found that, when the single crystal diamond is used as the substrate on which the epitaxial diamond layer grows, the (100) plane of the single crystal diamond imparts better crystallinity and larger carrier mobility to the grown layer than the (110) and (111) planes. As to a morphology, the surface of the grown layer on the (100) plane is more smooth. These advantages are important the device to function well.

The (111) plane has almost the same crystallinity as but less smoothness than the (100) plane. The (111) plane is less preferable than the (100) plane since it is difficult to polish the former.

The surface on which the epitaxial diamond layer with good smoothness and few crystalline defects is grown, has no inclination or inclines at an angle of not larger than 10° to the (100) plane because of polishing precision. The surface which inclines at the angle of preferably 0.1° to 5° to the (100) plane gives excellent schottky contact. The surface can be polished by, for example, a rotating scaife.

The single crystal diamond substrate may be a natural diamond or a single crystal diamond which is synthesized under ultra high pressure or in a vapor phase. The single crystal diamond substrate may be a single crystal diamond layer, for example, which is heteroepitaxially grown on a Si or GaAs substrate through a SiC buffer layer.

The epitaxial diamond layer is usually a p-type semiconductor and doped with a dopant such as boron or aluminum. The epitaxial diamond layer usually has a thickness of 0.05 to 20 μm, preferably 0.2 to 5 μm.

The vapor phase deposition methods for growing the epitaxial diamond layer include (1) a method comprising activating a feed gas by heating a material for thermoionic emission, (2) a method which utilizes a discharge from a direct current, high frequency of microwave electric field, (3) a method which utilizes an ion collision and (4) a method comprising decomposing gas molecules with light. Any of these methods produces the good epitaxial diamond layer.

The schottky electrode layer is preferably made of tungsten, molybdenum, niobium, tantalum, aluminum, polycrystalline silicon, nickel, gold, platinum, tungsten carbide, molybdenum carbide, tantalum carbide, niobium carbide, tungsten silicide or molybdenum silicide which is thermally resistant. The schottky electrode layer can be formed on the epitaxial diamond layer by a vacuum evaporation method, an ion plating method, a sputtering method, a chemical vapor deposition (CVD) method or a plasma CVD method. The schottky electrode layer usually has a thickness of 0.05 to 5 μm.

A semiconductor device such as a diode, a transistor or an integrated circuit which has the schottky contact according to the present invention has good thermal resistance and environmental resistance and can be used in a harsh environment such as in an automobile engine, a nuclear reactor or an artificial satellite.

Since the semiconductor device which has the schottky contact according to the present invention can be easily highly integrated because of, for example, the good thermal conductivity of the diamond, it can be used as a thermally resistant high speed logic operator device or a high-frequency large-output device.

Now, the present invention is explained by the following examples.

EXAMPLE 1

By a conventional microwave plasma CVD method, a boron-doped p-type semiconductor epitaxial diamond layer (thickness: 1 μm) was grown on a surface of a single crystal diamond substrate (size: 2 mm×1.5 mm×0.3 mm) which was synthesized under ultra high pressure. The surface inclined at an angle of not more than 5° to the (100) plane. The growing conditions were as follow:

Microwave power: 400 W
Reaction pressure: 40 torr
Feed gases: $CH_4/H_2 = 1/200$
Doping gas: $B_2H_6$ ($B_2H_6/CH_4 = 100$ ppm)

Figure 1B:
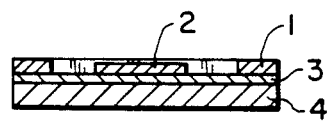
FIG. 1B is a sectional view of the device along the line A—A' of FIG. 1A.

On the epitaxial diamond layer, titanium (Ti), molybdenum (Mo) and gold (Au) layers (thickness: 0.3 μm each) were deposited in this order by electron beam deposition to form a laminated layer of them as an ohmic electrode. Then, a tungsten layer (thickness: 0.3 μm, diameter: 0.5 mm) was formed on the epitaxial diamond layer by sputtering (Ar pressure: 0.01 torr, R.F. power: 200 W). A resultant device which had the laminate layer 1, the tungsten layer 2, the epitaxial diamond layer 3 and the substrate 4 is schematically shown in FIGS. 1A and 1B. FIG. 1A is a plane view of the device. FIG. 1B is a sectional view along the line A—A' of FIG. 1A.

Figure 2A:
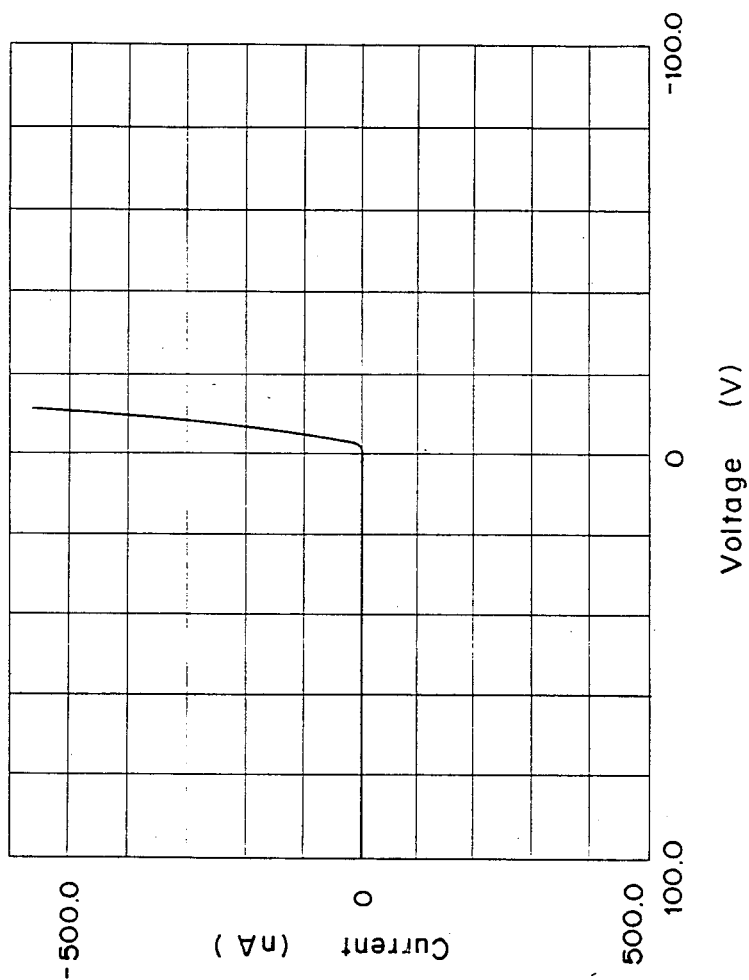
FIG. 2A, FIG. 2B, FIG. 3, FIG. 4 and FIG. 5 are graphs exhibiting the relationship between the voltage and the current in devices according to the present invention.
Figure 2B:
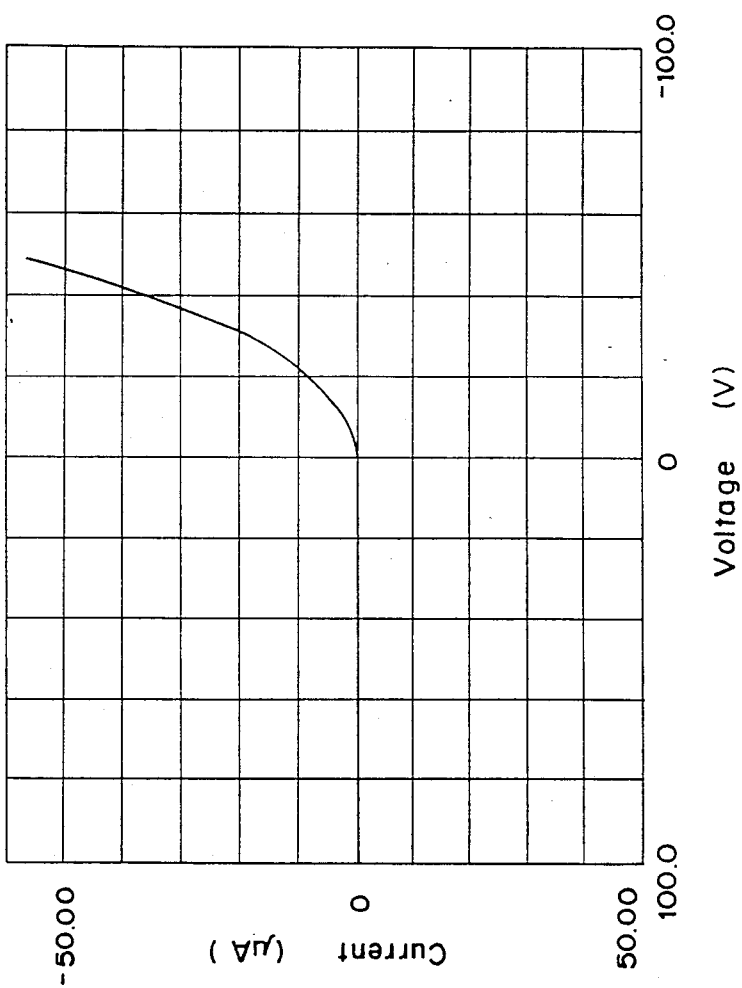

While a voltage of the laminate layer electrode was kept at zero and a voltage of the tungsten layer electrode was varied, the current was measured at an ambient temperature. The schottky characteristic as shown in FIG. 2A was observed. The device was kept at 300° C. and the current was measured in the same manner. The schottky characteristic as shown in FIG. 2B was also observed.

EXAMPLE 2

Figure 3:
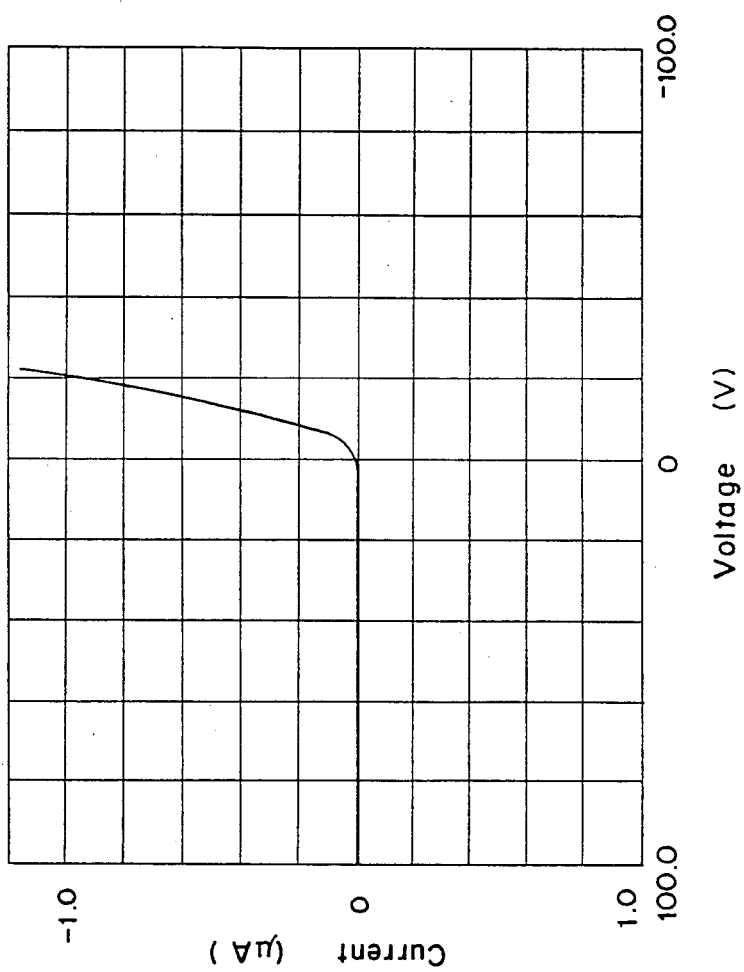

In the same manner as an Example 1, a laminate layer as an ohmic electrode was formed on a boron-doped p-type semiconductor epitaxial diamond layer and then a titanium layer was formed by electron beam deposition. The current was measured in the same way as in Example 1 to observe the schottky characteristic as shown in FIG. 3.

EXAMPLE 3

Figure 4:
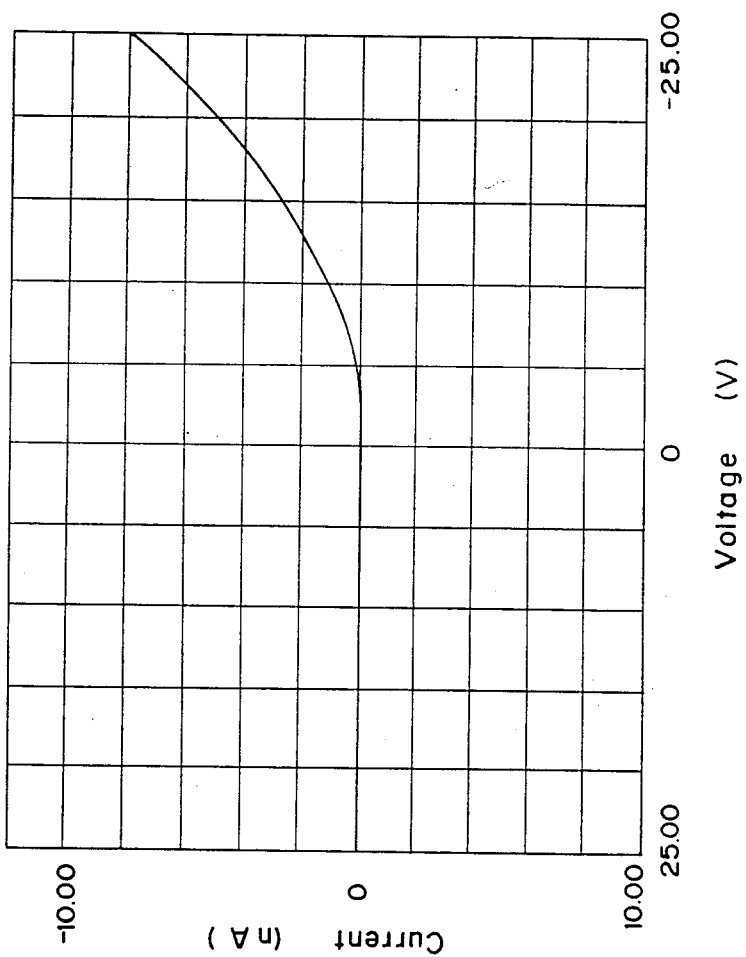

In the same manner as in Example 1, a laminate layer as the ohmic electrode was formed on a boron-doped p-type semiconductor epitaxial diamond layer and then a gold layer was formed by electron team deposition. The current was measured in the same way as in Example 1 to observe the schottky characteristic as shown in FIG. 4.

EXAMPLE 4

Figure 5:
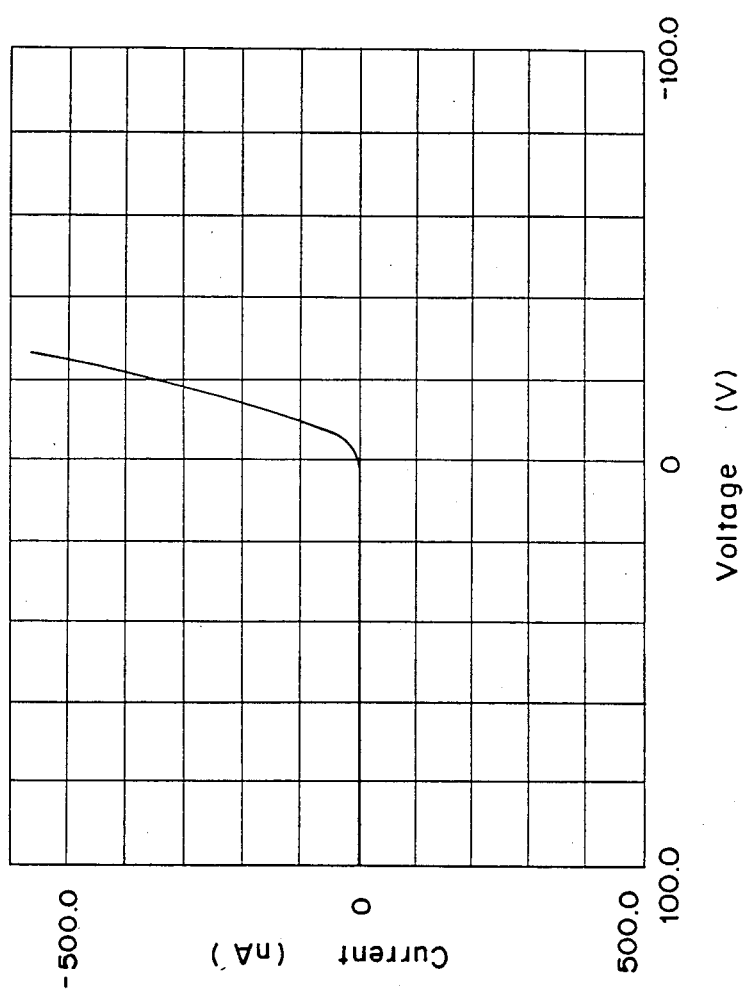

In the same manner as in Example 1, a boron-doped p-type semiconductor epitaxial diamond layer was formed on a (100) plane of a natural IIa-type diamond substrate (size: 2 mm×1.5 mm×0.3 mm), and then a laminate layer and a tungsten layer were formed. The current was measured in the same way as in Example 1 to observe the schottky characteristic as shown in FIG. 5.

What is claimed is:

1. A schottky contact comprising:
   a single crystal diamond substrate;
   an epitaxial diamond layer formed on said substrate; and
   a schottky electrode layer formed on said epitaxial diamond layer;
   wherein said substrate has at least one polished surface which inclines at an angle of less than 5° to a (100) plane and said epitaxial diamond layer is formed on said surface.

2. The schottky contact according to claim 1, wherein the surface inclines at the angle of 0.1° to 5° to the (100) plane.

3. The schottky contact according to claim 1, wherein the epitaxial diamond layer has a thickness of 0.05 to 20 μm.

4. The schottky contact according to claim 1, wherein the epitaxial diamond layer is a p-type semiconductor.

5. A semiconductor device which has the schottky contact according to claim 1.

6. A schottky contact according to claim 1, wherein the schottky electrode layer is made of at least one material selected from the group consisting of tungsten, molybdenum, niobium, tantalum, aluminum, polycrystalline silicon, nickel, gold, platinum, tungsten carbide, molybdenum carbide, tantalum carbide, niobium carbide, tungsten silicide and molybdenum silicide.

* * * * *